US012308869B2

(12) United States Patent
Han et al.

(10) Patent No.: US 12,308,869 B2
(45) Date of Patent: *May 20, 2025

(54) PHASE-RECONFIGURABLE CIRCUITS WITH PROGRAMMABLE POWER SPLITTING FOR DUAL-INPUT POWER AMPLIFIERS (71) Applicant: QUALCOMM Incorporated, San Diego, CA (US)

(72) Inventors: Guoxiang Han, San Diego, CA (US); Paolo Enrico De Falco, San Diego, CA (US); Antonino Scuderi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 26 days.

This patent is subject to a terminal disclaimer.

(21) Appl. No.: 18/335,776

(22) Filed: Jun. 15, 2023

(65) Prior Publication Data
US 2024/0421837 A1    Dec. 19, 2024

(51) Int. Cl.
*H04B 1/04*    (2006.01)
*H03F 1/02*    (2006.01)
*H03F 3/24*    (2006.01)
*H03H 7/06*    (2006.01)
*H03H 11/04*    (2006.01)

(52) U.S. Cl.
CPC ......... *H04B 1/0458* (2013.01); *H03F 1/0288* (2013.01); *H03F 3/245* (2013.01); *H03F 2200/451* (2013.01); *H03H 7/06* (2013.01); *H03H 11/0422* (2013.01)

(58) Field of Classification Search
CPC ..... H04L 25/06; H04L 25/061; H04L 25/069; H04L 25/068; H04L 25/067; H04B 17/345; H04B 17/336; H04B 17/318
See application file for complete search history.

(56) References Cited

U.S. PATENT DOCUMENTS

| 10,382,084 | B1* | 8/2019 | Huang | ............ | H04B 1/44 |
| 11,271,597 | B1* | 3/2022 | Huang | ............ | H03H 7/21 |
| 2009/0237161 | A1* | 9/2009 | Fagg | ............ | H03F 3/45242 |
| | | | | | 330/253 |
| 2011/0150495 | A1* | 6/2011 | Nosaka | ............ | H04B 10/505 |
| | | | | | 327/254 |

(Continued)

OTHER PUBLICATIONS

Greene K., et al., "Dual-Vector Phase Rotator for Doherty Beamformers", 2015 IEEE Radio Frequency Integrated Circuits Symposium (RFIC), May 17, 2015, pp. 331-334, XP032818649, p. 331, left-hand column, line 14-p. 334, left-hand column, line 17, figures 1-6.

(Continued)

*Primary Examiner* — Khanh C Tran
(74) *Attorney, Agent, or Firm* — QUALCOMM Incorporated (57) ABSTRACT A phase-reconfigurable circuit with programmable power splitting for a dual-input power amplifier is provided. The circuit includes an I/Q generator to generate I and Q RF signals from an input RF signal. A first vector-sum phase-shifter processes the I and Q RF signals to produce a first RF output signal. Similarly, a second vector-sum phase-shifter processes the I and Q RF signals to produce a second RF output signal.

30 Claims, 6 Drawing Sheets (56) References Cited

U.S. PATENT DOCUMENTS

2011/0236027 A1* 9/2011 Nosaka .............. H03F 3/45085
  323/311
2018/0006611 A1 1/2018 De Jong et al.

OTHER PUBLICATIONS

Hirai A., et al., "Vector-Sum Phase Shifter Using a Tunable Active gm-C Polyphase Filter", IEEE Transactions on Microwave Theory and Techniques, IEEE, USA, vol. 68, No. 10, Oct. 5, 2020, pp. 4091-4102, XP011812538, p. 4091, left-hand column, line 21-p. 4101, left-hand column, line 25, figures 1-23.
International Search Report and Written Opinion—PCT/US2024/029530—ISA/EPO—Oct. 2, 2024.
Peng Y., et al., "A V-Band Digital-Control Vector-Sum Phase Shifter in 28-nm Bulk CMOS", 2022 IEEE MTT-S International Microwave Workshop Series on Advanced Materials and Processes for RF and THZ Applications (IMWS-AMP), Nov. 27, 2022, 3 Pages, XP034335123, p. 1, left-hand column, line 16-p. 3, right-hand column, line 6, figures 1-9.
Co-pending U.S. Appl. No. 18/471,231, filed Sep. 20, 2023.

\* cited by examiner

PHASE-RECONFIGURABLE CIRCUITS WITH PROGRAMMABLE POWER SPLITTING FOR DUAL-INPUT POWER AMPLIFIERS

FIELD OF TECHNOLOGY

The present disclosure relates generally to wireless communications and more specifically to a phase-reconfigurable circuit with programmable power splitting for dual-input power amplifiers.

BACKGROUND

Modern wireless communication standards such as the fourth generation (4G) or fifth generation (5G) use orthogonal frequency division multiplexing (OFDM) due to its advantageous bandwidth utilization and robustness to electromagnetic interference. But the benefits of OFDM come at the cost of a relatively high peak-to-average-power-ratio (PAPR). To achieve good efficiency despite the high PAPR, various dual-input power amplifiers have been developed such as a Doherty amplifier. Other types of dual-input power amplifiers include outphasing power amplifiers, balanced power amplifiers, and load-modulated balanced power amplifiers.

SUMMARY

The following summary discusses some aspects of the present disclosure to provide a basic understanding of the discussed technology. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

In accordance with an aspect of the disclosure, a phase-reconfigurable circuit is provided that includes: a single-ended-to-differential converter configured to convert an RF input signal into a differential RF input signal; an I/Q generation circuit configured to convert the differential RF input signal into a differential in-phase RF signal and a differential quadrature-phase RF signal; a first vector-sum phase-shifter configured to process the differential in-phase RF signal and the differential quadrature-phase RF signal to produce a first differential RF signal; and a second vector-sum phase-shifter configured to process the differential in-phase RF signal and the differential quadrature-phase RF signal to produce a second differential RF signal.

In accordance with another aspect of the disclosure, a phase-reconfigurable circuit method is provided that includes: converting an RF input signal into a differential RF input signal; converting the differential RF input signal into a differential in-phase RF signal and a differential quadrature-phase RF signal; processing the differential in-phase RF signal and the differential quadrature-phase RF signal in a first vector-sum phase-shifter to produce a first differential RF signal; differential-to-single-ended converting the first differential RF signal into a first RF output signal; processing the differential in-phase RF signal and the differential quadrature-phase RF signal in a second vector-sum phase-shifter to produce a second differential RF signal; and differential-to-single-ended converting the second differential RF signal into a second RF output signal.

In accordance with yet another aspect of the disclosure, a dual-input amplifier is provided that includes: a first vector-sum phase-shifter configured to process a differential in-phase RF signal and a differential quadrature-phase RF signal to produce a first differential RF signal; a first differential-to-single-ended converter configured to convert the first differential RF signal into a first RF output signal; a first pre-driver amplifier configured to amplify the first RF output signal to form a first pre-driver RF signal; a first driver amplifier configured to amplify the first pre-driver RF signal to form a first driver RF signal; and a first power amplifier configured to amplify the first driver RF signal to form a first power amplifier RF output signal.

Finally, in accordance with another aspect of the disclosure, a transmitter is provided that includes: an I/Q generation circuit configured to convert an RF input signal into an in-phase RF signal and a quadrature-phase RF signal, the I/Q generation circuit comprising a polyphase filter: a first vector-sum phase-shifter configured to process the in-phase RF signal and the quadrature-phase RF signal to produce a first RF signal; a second vector-sum phase-shifter configured to process the in-phase RF signal and the quadrature-phase RF signal to produce a second RF signal; one or more first amplifiers configured to amplify the first RF signal to produce a first amplified RF signal; one or more second amplifiers configured to amplify the second RF signal to produce a second amplified RF signal; and a combiner configured to combine the first amplified RF signal and the second amplified RF signal to form a combined RF output signal.

Other aspects, features, and implementations of the present disclosure will become apparent to those of ordinary skill in the art, upon reviewing the following description of specific, exemplary implementations of the present disclosure in conjunction with the accompanying figures. While features of the present disclosure may be discussed relative to certain implementations and figures below, all implementations of the present disclosure can include one or more of the advantageous features discussed herein. In other words, while one or more implementations may be discussed as having certain advantageous features, one or more of such features may also be used in accordance with the various implementations of the disclosure discussed herein. In similar fashion, while exemplary implementations may be discussed below as device, system, or method implementations it should be understood that such exemplary implementations can be implemented in various devices, systems, and methods.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various implementations and to explain various principles and advantages in accordance with the present disclosure.

DETAILED DESCRIPTION

To efficiently amplify high-PAPR signals, various dual-input power amplifier architectures such as Doherty power amplifiers, outphasing power amplifiers, balanced power amplifiers, and load-modulated balanced power amplifiers have been developed. In these architectures, a radio frequency (RF) input signal is split in an input circuit that may also be denoted herein as a splitter to drive each input of a dual-input power amplifier. In particular, the splitter splits the input RF signal into a first RF signal and into a second RF signal. The first RF signal drives a first input terminal of the dual-input power amplifier. Similarly, the second RF signal drives a second input terminal of the dual-input power simplifier. Not only does the splitter split the input RF signal, but the splitter may also phase shift the second RF signal as compared to the first RF signal.

For certain dual-input power amplifiers, the splitting by the splitter of the RF input signal is typically an even splitting such that a power of the first RF signal equals a power of the second RF signal. This splitting is commonly a quadrature splitting in which the second RF signal is delayed in phase by 90° with respect to a phase of the first RF signal. More generally, however, various dual-input power amplifiers have been developed in which both the power splitting is not even and in which the phase shifting is not a quadrature phase shifting. For example, a generalized Doherty amplifier has been developed in which the power splitting and the phase shifting vary from their conventional values. More generally, dual-input power amplifiers have been developed in which the power splitting and the phase shifting vary from their conventional values. The following discussion will thus be directed to an advantageous phase-reconfigurable circuit with programmable power splitting for a generalized dual-input power amplifier.

Note that a dual-input power amplifier may not be the only amplifier in the transmit chain in a wireless transceiver (WTR) for a mobile device. The dual-input power amplifier (PA) instead may be the final amplifier in a chain of amplifiers such as formed by a pre-driver amplifier (PDA) and a driver amplifier (DA). For example, the pre-driver amplifier is the first amplifier in the amplification chain. The driver amplifier is the next amplifier in the amplifier chain and thus functions to amplify a pre-driver output signal from the pre-driver amplifier. The power amplifier then amplifies a driver output signal from the driver amplifier and thus functions as the final amplifier in the amplifier chain. Given this amplifier chain, there several options for the location of the splitter that correspond to Doherty amplifier configurations.

In a first Doherty amplifier configuration, the splitter intervenes between the driver amplifier and the power amplifier. Such a configuration may be relatively low-cost but the relatively high power of the driver amplifier output signal (e.g., approximately 20 dBm) generally requires the splitter to use analog phase shifting having no or minimum tunability. In a second Doherty amplifier configuration, the splitter intervenes between the pre-driver amplifier and the driver amplifier. The reduced power output of the pre-driver amplifier (e.g., 5 to 6 dBm) allows the splitter to have a limited amount of tunability but the phase shifting is still analog which may reduce tunability options. In contrast, the splitter is upstream to the pre-driver amplifiers in a third Doherty amplifier configuration. A splitter according to this third Doherty amplifier configuration may thus use digitally-controlled phase shifters that provide a full 360° of phase tunability. A particularly advantageous splitter (which may also be denoted as a phase-reconfigurable circuit with programmable power splitting) for this third Doherty amplifier configuration will now be discussed in more detail in which a single-ended RF input signal is first transformed into a differential RF input signal. An I/Q generation circuit such as a polyphase filter converts the differential RF input signal into a differential in-phase (I) RF signal and a differential quadrature-phase (Q) RF signal.

A first vector-sum phase shifter processes the I and Q RF signals to produce a first differential RF output signal that is then amplified such as by a first pre-driver amplifier and a first driver amplifier to form a first RF signal. In a Doherty amplifier implementation, the main amplifier amplifies the first RF signal. More generally, the first RF signal drives a first input terminal of a dual-input power amplifier. Similarly, a second vector-sum phase shifter processes the I and Q RF signals to produce the second differential RF output signal that is then amplified such as by a second pre-driver amplifier and a second driver amplifier to form a second RF signal. In a Doherty amplifier implementation, the auxiliary amplifier amplifies the second RF signal. More generally, the second RF signal drives the second input terminal of a dual-input power amplifier.

Figure 1A:
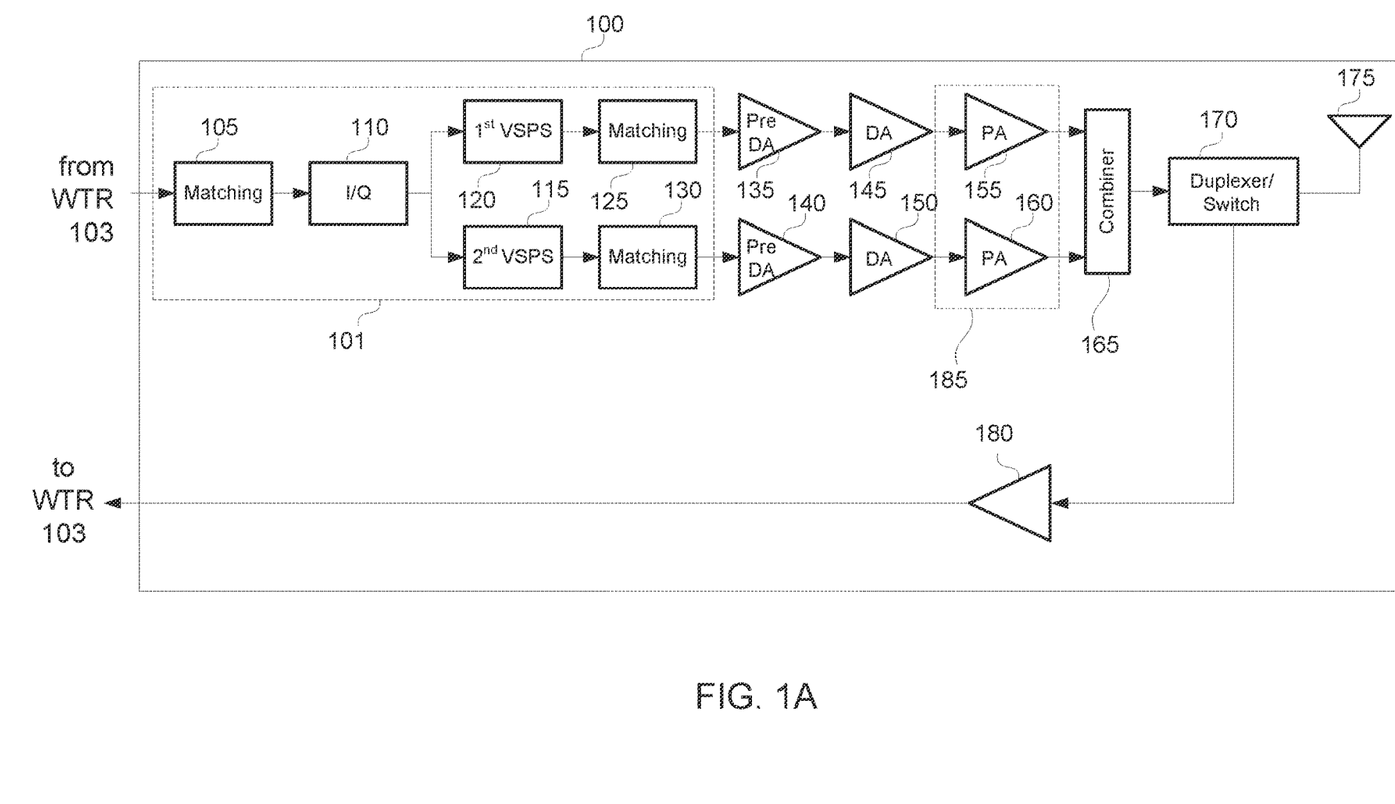
FIG. 1A is a diagram of a first portion of a transceiver circuit including a phase-reconfigurable splitter and a dual-input power amplifier in accordance with an aspect of the disclosure.

Turning now to the drawings, an example front-end module 100 including a phase-reconfigurable circuit for programmable power splitting 101 is shown in FIG. 1A. A wireless transceiver (WTR) (discussed further with regard to FIG. 1B) generates a modulated RF input signal that is converted into a differential RF input signal by a single-ended-to-differential converter 105 that may also be denoted as a matching network since it matches an output impedance of the WTR to an input impedance of an I/Q generation circuit 110. The I/Q generation circuit 110 converts the differential RF input signal from the converter 105 into the differential I and Q RF signals. For illustration clarity, the differential I and Q RF signals are conceptually represented by a common output signal from the I/Q generation circuit 110. As will be explained further herein, the I/Q generation circuit 110 may be a transformer-based I/Q generator, a polyphase filter, or other types of suitable I/Q generators. A first vector-sum phase-shifter (VSPS) 120 applies an individual digital gain to each of the I and Q signals to produce the first differential RF output signal that is then converted into a first single-ended RF signal by a differential-to-single-ended converter 125. The converter 125 may also be denoted as a matching network analogously as discussed for converter 105. A first amplification chain (which may also be denoted as one or more first amplifiers) such as formed by a pre-driver amplifier 135 and a driver amplifier 145 amplifies the first single-ended RF signal to form the first RF signal that will be amplified by a first power amplifier 155 to form a first amplified RF signal (which may also be denoted as a first power amplifier signal) received by a combiner 165.

A second VSPS 115 also applies an individual digital gain to the I and Q RF signals to produce the second differential RF output signal that is then converted into a second single-ended RF signal by a differential-to-single-ended converter 130. The converter 130 may also be denoted as a matching network analogously as discussed for converter 105. A second amplification chain (which may also be denoted as one or more second amplifiers) such as formed by a pre-driver amplifier 140 and a driver amplifier 150 amplifies the second single-ended RF signal to form the second RF signal that will be amplified by a second power amplifier 160 to form a second amplified RF signal (which may also be denoted as a second power amplifier signal) received by the combiner 165. The combiner 165 combines the first and second power amplifier RF signals to form a combined RF output signal that may pass through an antenna switch module (duplexer/switch) 170 to an antenna(s) 175 for wireless transmission. During a receive mode, the antenna switch module 170 selects for a low-noise amplifier (LNA) 180 so that an RF received signal from the antenna(s) 175 may be amplified and presented to the WTR. It will be appreciated that the antenna switch 170 may be omitted in implementations having dedicated receive and transmit antennas.

Figure 1B:
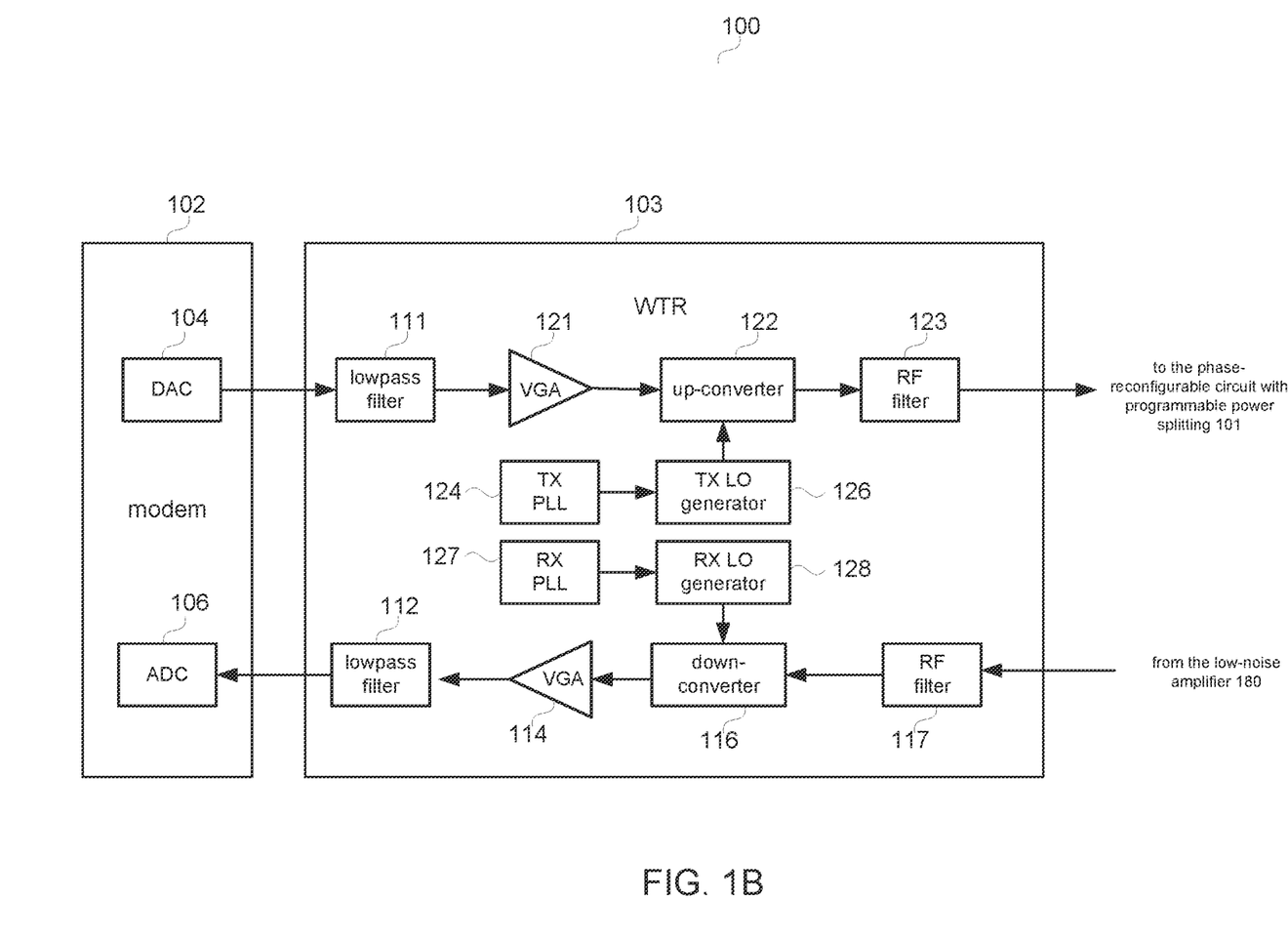
FIG. 1B is a diagram of a second portion of a transceiver circuit in accordance with an aspect of the disclosure.

An example wireless transceiver (transmitter-receiver) 103 and a modem 102 are shown in FIG. 1B. The modem 102 (which may also be denoted as a baseband processor) includes at least one DAC 104 for generating an analog transmit signal. The WTR 103 includes a lowpass filter 111 for filtering the analog transmit signal to provide a filtered analog signal to a variable gain amplifier (VGA) 121. An up-converter 122 (such as one or more mixers) up converts an amplified analog signal from the VGA 121 in frequency to produce an RF signal. For example, the up-converter 122 may mix the amplified analog signal with a local oscillator (LO) signal from a transmit (TX) LO generator 126. An oscillator such as a TX phase-locked loop (PLL) 124 clocks the TX LO generator 126 for the generation of the TX LO signal. An RF filter 123 filters the RF signal from the up-converter to produce the modulated RF input signal that will be processed by the phase-reconfigurable circuit 101.

The WTR 103 also includes an RF filter 117 for filtering the amplified RF received signal from the LNA 180 A down-converter 116 (such as one or more mixers) down converts the filtered RF signal from the RF filter 117 in frequency to produce a down-converted analog signal. For example, the down-converter 116 may mix the filtered RF signal with an LO signal from a receive (RX) LO generator 128. An oscillator such as an RX phase-locked loop (PLL) 127 clocks the RX LO generator 128 for the generation of the RX LO signal. Another VGA 114 amplifies the down-converted analog signal to drive a lowpass filter 112 that provides a filtered analog signal to an analog-to-digital (ADC) 106 in modem 102. The ADC 106 recovers the digital baseband signal for further processing by modem 102. It will be appreciated that WTR 103 is merely exemplary and that other transceiver architectures may be used in conjunction with the phase-reconfigurable circuit 101.

Referring again to the front-end module 100, in a Doherty amplifier implementation, the first power amplifier 155 may be a main amplifier whereas the second power amplifier 160 may be an auxiliary amplifier. The auxiliary amplifier is typically biased for class C operation such that it cuts off and does not contribute to the output RF signal at lower amplitudes of the RF input signal. The main amplifier may be biased for class AB operation. With the RF input signal above the cutoff point of the auxiliary amplifier, the active load pulling between the auxiliary amplifier and the main amplifier at the combiner 165 keeps the Doherty amplifier impedance matched. More generally, first and second power amplifiers 155 and 160 form a dual-input power amplifier 185. In various implementations, the dual-input power amplifier 185 may instead be a balanced amplifier, an outphasing amplifier, or a load-modulated balanced amplifier. Some example implementations of the phase-reconfigurable circuit for programmable power splitting 101 will now be discussed in more detail.

Figure 2A:
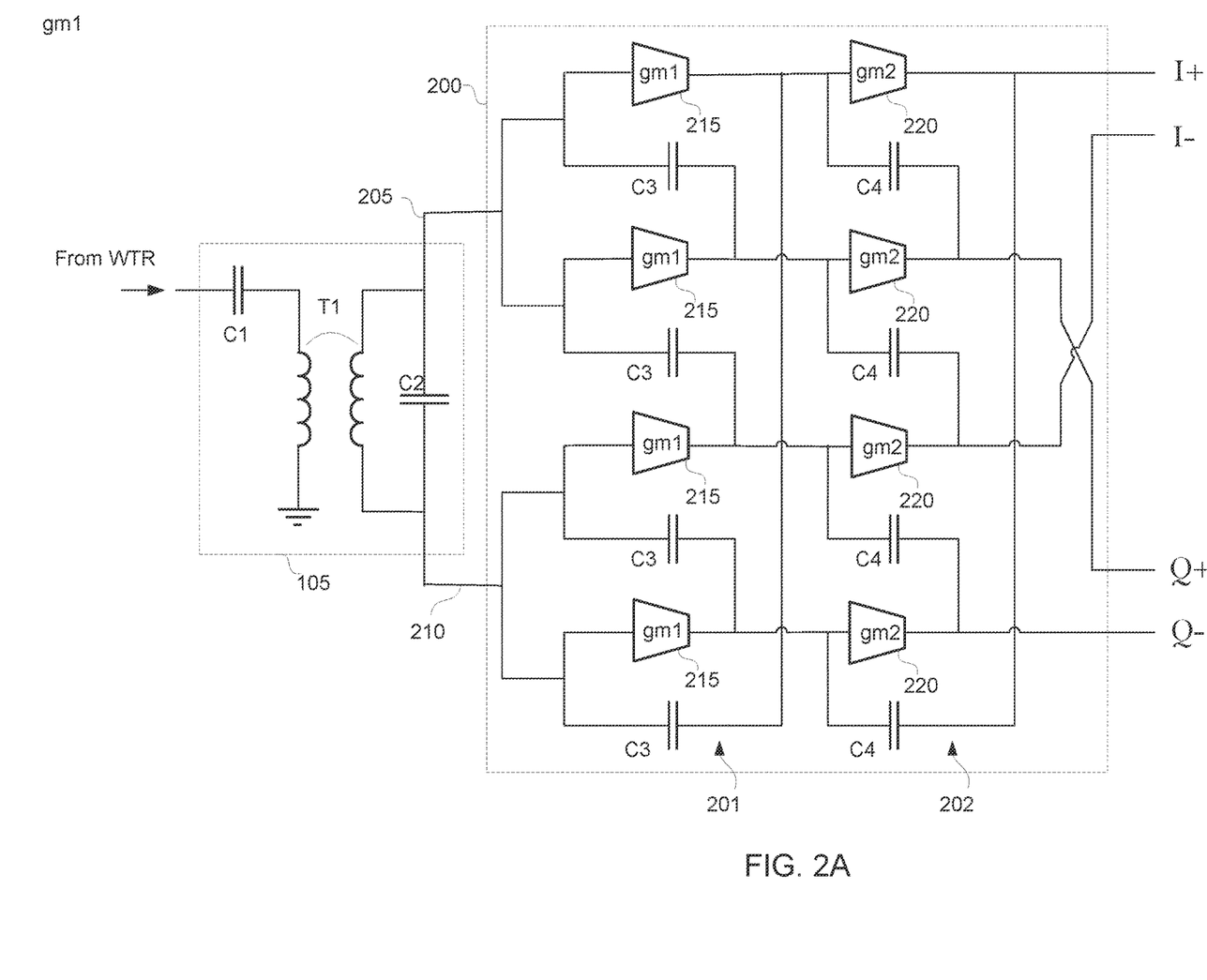
FIG. 2A is a circuit diagram of a single-ended-to-differential converter and a gm-C polyphase filter in accordance with an aspect of the disclosure.

As shown in FIG. 2A, the single-ended-to-differential converter 105 may include a capacitor C1 that couples between an output node of the WTR and a primary winding of a transformer T1. A capacitor C2 couples between the output terminals 205 and 210 of a secondary winding of the transformer T1. A single-ended RF input signal from the WTR is thus converted to a differential RF input signal across the output terminals 205 and 210 of the secondary winding of the transformer T1. In one implementation, the I/Q generation circuit 110 may be a polyphase filter such as a two-stage transconductance-capacitor (gm-C) polyphase filter 200 having a first stage 201 and a second stage 202. In the first stage 201, four transconductance amplifiers 215 each provides a transconductance gm1 and are arranged with four corresponding capacitors C3 to create a first pole frequency that is a function of the transconductance gm1 and the capacitance C3. Similarly, the second stage 201 includes four transconductance amplifiers 220 that each provides a transconductance gm2 and are arranged with four corresponding capacitors C4 to create a second pole frequency that is a function of the transconductance gm2 and the capacitance C4. By a suitable setting of the two pole frequencies, polyphase filter 200 provides high quality differential signals I+, I−, Q+, and Q− having satisfactory phase and gain matching.

Figure 2B:
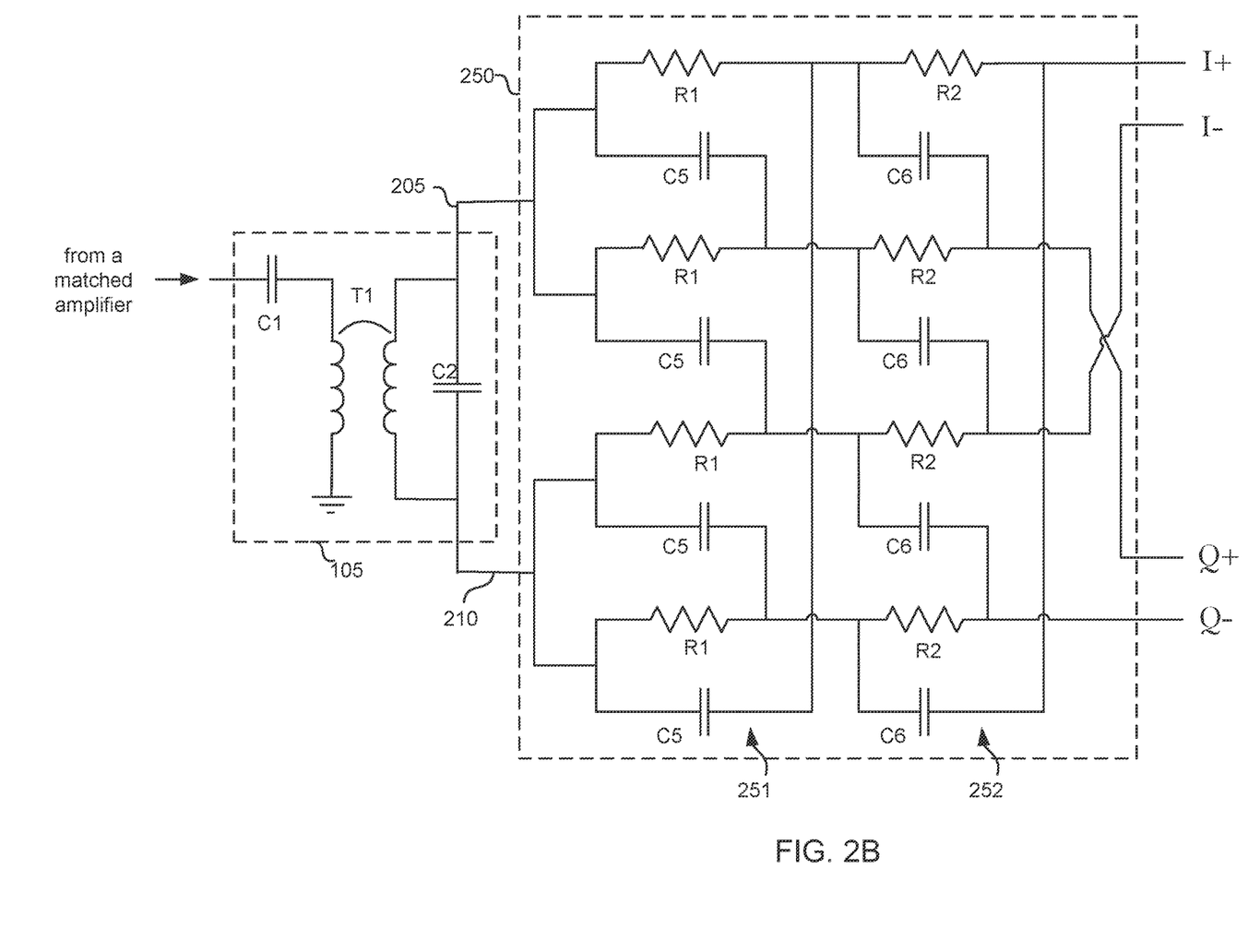
FIG. 2B is a circuit diagram of a single-ended-to-differential converter and an RC polyphase filter in accordance with an aspect of the disclosure.

The converter 105 is shown again in FIG. 2B for an implementation in which the I/Q generator 110 is formed by a two-stage resistor-capacitor (RC) two-stage polyphase filter 250 having a first stage 251 and a second stage 252. First stage 251 includes four resistors R1 arranged with four corresponding capacitors C5 to provide a first pole frequency that is a function of the resistance R1 and the capacitance C5. Similarly, second stage 252 includes four resistors R2 arranged with four corresponding capacitors C6 to provide a second pole frequency that is a function of the resistance R2 and the capacitance C6. As discussed for the gm-C polyphase filter 200, a suitable setting of the two pole frequencies for the RC polyphase filter 250 leads to high quality differential signals I+, I−, Q+, and Q− with satisfactory phase and gain matching. As compared to the gm-C polyphase filter 200, the RC polyphase filter 250 consumes no current and is very linear. However, since the RC polyphase filter 250 is passive whereas the transconductance amplifiers in the gm-C polyphase filter 200 provide gain, an RF amplifier (not illustrated) may be required to amplify the RF input signal from the WTR before it is differentially converted in the converter 105. In another passive implementation, a differential, transformer-based I/Q generation circuit may be used in lieu of a polyphase filter to form the I/Q generator 110 to generate the in-phase and quadrature-phase RF signals. Since a transformer-based I/Q generation circuit is also passive, an additional RF amplifier may be required as discussed for the RC polyphase filter implementation. The gm-C polyphase filter 200, the RC polyphase filter 250, and the transformer-based I/Q generation circuit are all examples of a means for generating an in-phase RF signal and a quadrature-phase RF signal. The first VSPS 120 is an example of a first means for amplifying and combining the in-phase RF signal and the quadrature-phase RF signal to provide a first phase-shifted RF signal. The second VSPS 115 is an example of a second means for amplifying and combining the in-phase RF signal and the quadrature-phase RF signal to provide a second phase-shifted RF signal.

Figure 3:
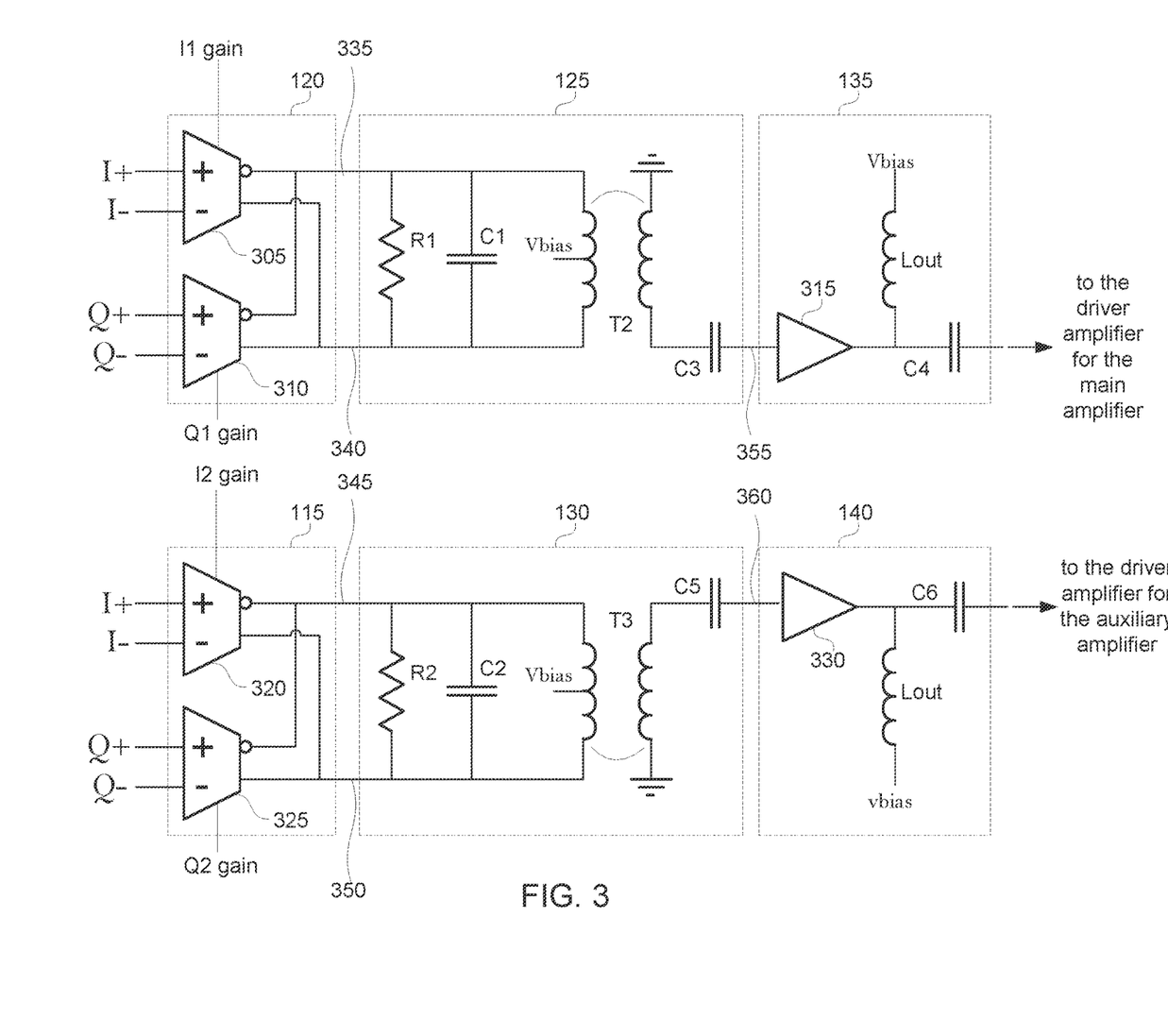
FIG. 3 is a circuit diagram of a first and second vector-sum phase-shifters and corresponding differential-to-single-ended converters in accordance with an aspect of the disclosure.

Some example implementations of the first VSPS 120, the differential-to-single-ended converter 125, the pre-driver amplifier 135, the second VSPS 115, the differential-to-single-ended converter 130, and pre-driver amplifier 140 will now be discussed with respect to FIG. 3. In this implementation, the differential in-phase and quadrature-phase signals are voltage signals. The first VSPS 120 thus includes a first transconductance amplifier 305 for transconducting the I+ and I− signals into a first differential current output signal expressed across a first pair of output terminals 335 and 340. The first VSPS 120 also includes a second transconductance amplifier 310 for transconducting the Q+ and the Q− signals into the differential current output signal. The differential-to-single-ended converter 125 couples the output terminals 335 and 340 to a primary winding of a transformer T2. A secondary winding of the transformer T2 couples through a capacitor C3 to a single-ended output terminal 355. A resistor R1 and a capacitor C1 that couple in parallel with the primary winding function in conjunction with the capacitor C3 for impedance matching. In this implementation, a bias voltage Vbias biases a center tap of the primary winding of the transformer T2. The pre-driver amplifier 135 includes an amplifier 315 for amplifying an output signal from terminal 355 to form the first RF signal that will be amplified by the driver amplifier 145 and the power amplifier 155. An inductor Lout that couples between an output terminal of the amplifier 315 and a node for the bias voltage Vbias as well as a capacitor C4 that couples between the output terminal of the amplifier 315 and an input terminal to the driver amplifier 145 (FIG. 1A) provide impedance matching and compensation to the amplifier 315. It will be appreciated that the phase-reconfiguration circuit with programmable power splitting disclosed herein may be used in any suitable amplification chain that may or may not include pre-driver amplifiers and a driver amplifiers.

Similarly, the second VSPS 115 includes a third transconductance amplifier 320 for transconducting the I+ and I− signals into a second differential current output signal expressed across a second pair of output terminals 345 and 350 and a fourth transconductance amplifier 325 for transconducting the Q+ and the Q− signals into a second differential current output signal. The differential-to-single-ended converter 130 couples the output terminals 345 and 350 to a primary winding of a transformer T3. A secondary winding of the transformer T3 couples through a capacitor C5 to a single-ended output terminal 360. A resistor R2 and a capacitor C2 that couple in parallel with the primary winding function in conjunction with the capacitor C5 for impedance matching. In this implementation, the bias voltage Vbias biases a center tap of the primary winding of the transformer T3. The pre-driver amplifier 135 includes an amplifier 330 for amplifying an output signal from the terminal 360 to form the second RF signal that will be amplified by the driver amplifier 150 and the power amplifier 160. An inductor Lout that couples between an output terminal of the amplifier 330 and a node for the bias voltage Vbias as well as a capacitor C5 that couples between the output terminal of the amplifier 330 and an input terminal to the driver amplifier 150 (FIG. 1A) provide impedance matching and compensation to the amplifier 330. Note that the differential-to-single-ended converters such as the differential-to-single-ended converters 125 and 130 may be situated at any suitable location in the amplification chains including after the power amplifiers, between the power amplifiers and the corresponding driver amplifiers, or between the driver amplifiers and the corresponding pre-driver amplifiers.

For the first VSPS 120, the first transconductance amplifier 305 applies a digital gain I1 to the in-phase differential signal. Similarly, the second transconductance amplifier 310 applies a digital gain Q1 to the quadrature-phase differential signal. Depending upon the dynamic range given by the digital width/number of bits corresponding to the digital gains I1 and Q1, a variable phase and amplitude is provide to the first differential output current produced by the first VSPS 120. For example, suppose that the first transconductance amplifier 305 and the second transconductance amplifier 310 are composed of multiple unit cells (the gains I1 and Q1 being selected by digital words). In that regard, the transconductance amplifiers 305 and 310 can be realized in different resolutions such as 3 bits (7 unit cells). 4 bits (15 unit cells). 5 bits (31 unit cells), and so on. As the number of bits is increased, the phase-shift resolution is increased accordingly. For example, a 3-bit resolution gives approximately 8° of phase-shift resolution, a 4-bit resolution provides approximately 4° of phase-shift resolution, and so on. If each bit of gain corresponds to a unit amplitude, the in-phase differential signal and the quadrature-phase differential signal may each be amplified accordingly. Note that both the phase of the first differential output current as well as its amplitude may be adjusted according to the digital I1 and Q1 gains. For example, if some proportionality is maintained between these gains but their magnitude is varied, the amplitude of the first differential output current will vary accordingly but have a constant phase. As the proportionality between the gains is changed, the phase of the first differential output current will change accordingly. A set of digital gains I2 and Q2 for the second VSPS 115 control the amplitude and phase of the second differential output current accordingly. Not only is the phase shifting configurable between the first and second RF signals that will drive the dual-input amplifier but the circuits disclosed herein also provide matched RF group delays to the first and second RF signals. In this fashion, both an asymmetric power splitting between the first and second RF signals amplified by the first and second power amplifiers 55 and 160 (FIG. 1A) as well as the reconfigurable phase between the first and second RF signals may be controlled accordingly. It will be appreciated that first VSPS 120 and second VSPS 115 are merely exemplary and that other suitable VSPS architectures may be implemented in the phase-reconfigurable circuits with programmable power splitting disclosed herein.

Figure 4:
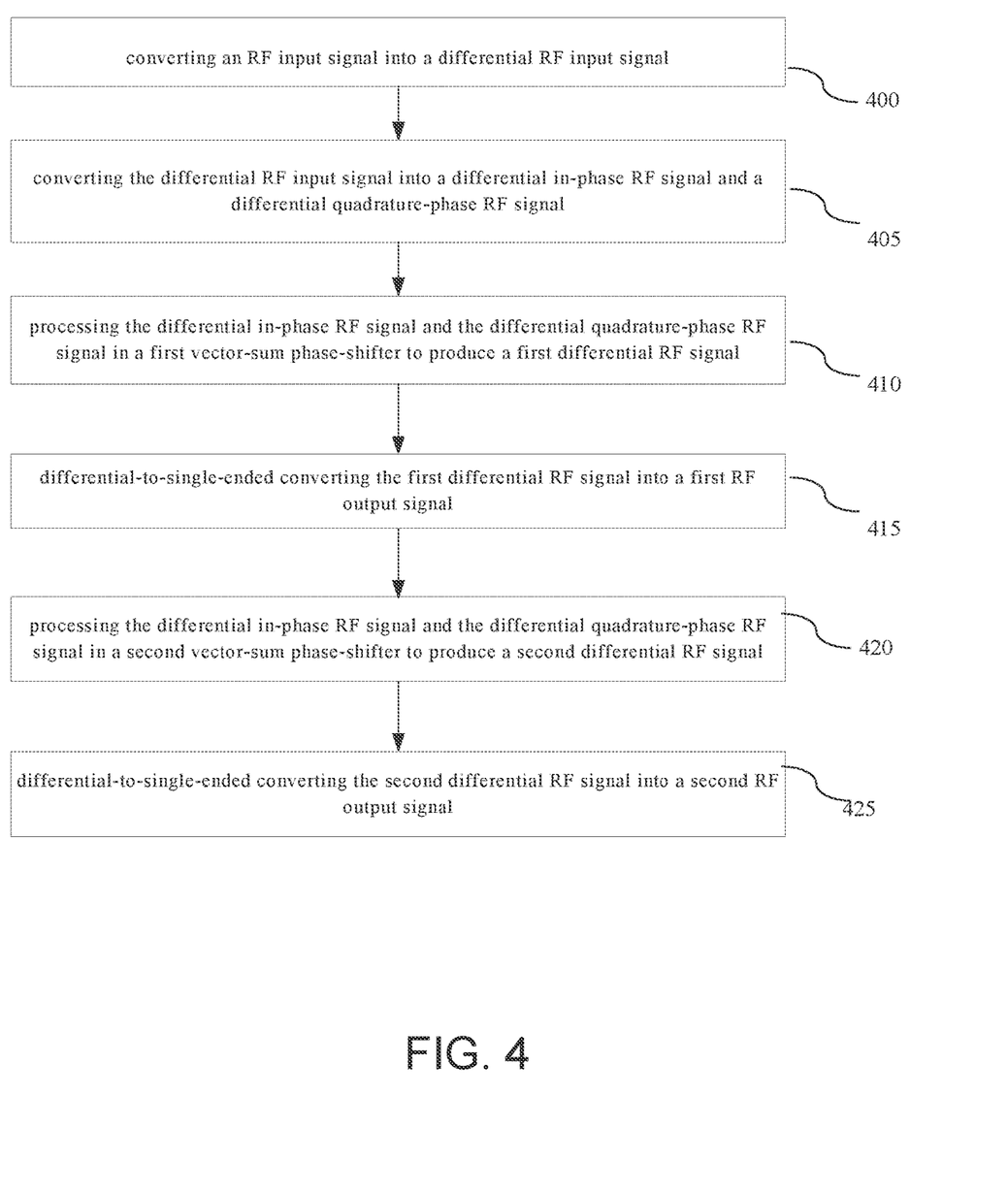
FIG. 4 is a flowchart of a phase-reconfigurable splitting method in accordance with an aspect of the disclosure.

A phase-reconfigurable circuit method will now be discussed with regard to the flowchart of FIG. 4. The method includes an act 400 of converting an RF input signal into a differential RF input signal. The conversion by the single-ended-to-differential converter 105 is an example of act 400. The method further includes an act 405 of converting the differential RF input signal into a differential in-phase RF signal and a differential quadrature-phase RF signal. The conversion by the I/Q generator 110 is an example of act 405. In addition, the method includes an act 410 of processing the differential in-phase RF signal and the differential quadrature-phase RF signal in a first vector-sum phase-shifter to produce a first differential RF signal. The processing by first VSPS 120 is an example of act 410. The method also includes an act 415 of differential-to-single-ended converting the first differential RF signal into a first RF output signal. The conversion by the differential-to-single-ended converter 125 is an example of act 415. The method also includes an act 420 of processing the differential in-phase RF signal and the differential quadrature-phase RF signal in a second vector-sum phase-shifter to produce a second differential RF signal. The processing by the second VSPS 115 is an example of act 420. Finally, the method includes an act 425 of differential-to-single-ended converting the second differential RF signal into a second RF output signal. The conversion by the differential-to-single-ended converter 130 is an example of act 425.

The disclosure will now be summarized in the following example clauses:

Clause 1. A phase-reconfigurable circuit, comprising:
a single-ended-to-differential converter configured to convert an RF input signal into a differential RF input signal;
an I/Q generation circuit configured to convert the differential RF input signal into a differential in-phase RF signal and a differential quadrature-phase RF signal;
a first vector-sum phase-shifter configured to process the differential in-phase RF signal and the differential quadrature-phase RF signal to produce a first differential RF signal; and
a second vector-sum phase-shifter configured to process the differential in-phase RF signal and the differential quadrature-phase RF signal to produce a second differential RF signal.

Clause 2. The phase-reconfigurable circuit of clause 1, wherein the I/Q generation circuit comprises a polyphase filter.

Clause 3. The phase-reconfigurable circuit of clause 2, wherein the polyphase filter comprises a transconductance-capacitor (gm-C) polyphase filter.

Clause 4. The phase-reconfigurable circuit of clause 2, wherein the polyphase filter comprises a resistor-capacitor (RC) polyphase filter.

Clause 5. The phase-reconfigurable circuit of claim 1, wherein the I/Q generation circuit comprises a transformer-based I/Q generation circuit.

Clause 6. The phase-reconfigurable circuit of clause 3, wherein the gm-C polyphase filter comprises a two-stage gm-C polyphase filter.

Clause 7. The phase-reconfigurable circuit of any of clauses 1-6, wherein the first vector-sum phase-shifter comprises:
a first pair of output terminals;
a first transconductance amplifier configured to transconduct the differential in-phase RF signal to output a first differential current across the first pair of output terminals; and
a second transconductance amplifier configured to transconduct the differential quadrature-phase RF signal to output a second differential current across the first pair of output terminals.

Clause 8. The phase-reconfigurable circuit of clause 7, wherein the second vector-sum phase-shifter comprises:
a second pair of output terminals;
a third transconductance amplifier configured to transconduct the differential in-phase RF signal to output a third differential current across the second pair of output terminals; and
a fourth transconductance amplifier configured to transconduct the differential quadrature-phase RF signal to output a fourth differential current across the second pair of output terminals.

Clause 9. The phase-reconfigurable circuit of any of clauses 1-8, further comprising:

a first differential-to-single-ended converter configured to convert the first differential RF signal into a first single-ended RF output signal; and
a second differential-to-single-ended converter configured to convert the second differential RF output signal into a second single-ended RF output signal, wherein the phase-reconfigurable circuit is integrated into a transmitter including:
a first pre-driver amplifier configured to amplify the first single-ended RF output signal to form a first pre-driver RF output signal; and
a second pre-driver amplifier configured to amplify the second single-ended RF output signal to form a second pre-driver RF output signal.

Clause 10. The phase-reconfigurable circuit of clause 9, wherein the transmitter further includes:
a first driver amplifier configured to amplify the first pre-driver RF output signal to form a first driver RF output signal; and
a second driver amplifier configured to amplify the second pre-driver RF output signal to form a second driver RF output signal.

Clause 11. The phase-reconfigurable circuit of clause 10, wherein the transmitter further includes:
a dual-input power amplifier including a first power amplifier configured to amplify the first driver RF output signal to form a first power amplifier output signal and a second power amplifier configured to amplify the second driver RF output signal to form a second power amplifier output signal; and
a combiner configured to combine the first driver RF output signal and the second driver RF output signal to form a combined RF output signal.

Clause 12. The phase-reconfigurable circuit of clause 11, wherein the dual-input power amplifier comprises a Doherty amplifier.

Clause 13. The phase-reconfigurable circuit of clause 11, wherein the dual-input power amplifier comprises an outphasing amplifier.

Clause 14. The phase-reconfigurable circuit of clause 11, wherein the dual-input power amplifier comprises a balanced amplifier.

Clause 15. The phase-reconfigurable circuit of clause 14, wherein the balanced amplifier comprises a load-modulated balanced amplifier.

Clause 16. A phase-reconfigurable circuit method, comprising:
converting an RF input signal into a differential RF input signal;
converting the differential RF input signal into a differential in-phase RF signal and a differential quadrature-phase RF signal;
processing the differential in-phase RF signal and the differential quadrature-phase RF signal in a first vector-sum phase-shifter to produce a first differential RF signal;
differential-to-single-ended converting the first differential RF signal into a first RF output signal;
processing the differential in-phase RF signal and the differential quadrature-phase RF signal in a second vector-sum phase-shifter to produce a second differential RF signal; and
differential-to-single-ended converting the second differential RF signal into a second RF output signal.

Clause 17. The method of clause 16, further comprising:
amplifying both the first RF output signal and the second RF output signal in a dual-input power amplifier to produce a combined RF output signal.

Clause 18. The method of clause 16, wherein processing the differential in-phase RF signal and the differential quadrature-phase RF signal in the first vector-sum phase-shifter comprises:
selecting from a set of in-phase gains to provide a selected in-phase gain
amplifying the in-phase differential RF signal by the selected in-phase gain to provide an amplified in-phase differential RF signal;
selecting from a set of quadrature-phase gains to provide a selected quadrature-phase gain
amplifying the quadrature-phase differential RF signal by the selected quadrature-phase gain to provide an amplified quadrature-phase differential RF signal; and
combining the amplified in-phase differential RF signal and the amplified quadrature-phase differential RF signal to form the first differential RF signal.

Clause 19. The method of clause 17, further comprising:
transmitting the combined RF output signal over at least one antenna.

Clause 20. A dual-input amplifier, comprising:
a first vector-sum phase-shifter configured to process a differential in-phase RF signal and a differential quadrature-phase RF signal to produce a first differential RF signal;
a first differential-to-single-ended converter configured to convert the first differential RF signal into a first RF output signal;
a first pre-driver amplifier configured to amplify the first RF output signal to form a first pre-driver RF signal;
a first driver amplifier configured to amplify the first pre-driver RF signal to form a first driver RF signal; and
a first power amplifier configured to amplify the first driver RF signal to form a first power amplifier RF output signal.

Clause 21. The dual-input amplifier of clause 20, further comprising:
a second vector-sum phase-shifter configured to process the differential in-phase RF signal and the differential quadrature-phase RF signal to produce a second differential RF signal;
a second differential-to-single-ended converter configured to convert the second differential RF signal into a second RF output signal;
a second pre-driver amplifier configured to amplify the second RF output signal to form a second pre-driver RF signal;
a second driver amplifier configured to amplify the second pre-driver RF signal to form a second driver RF signal; and
a second power amplifier configured to amplify the second driver RF signal to form a second power amplifier RF output signal.

Clause 22. The dual-input amplifier of clause 21, further comprising:
a combiner configured to combine the first power amplifier RF output signal with the second power amplifier RF output signal to form a combined RF output signal.

Clause 23. The dual-input amplifier of clause 22, wherein the dual-input amplifier is integrated into a transmitter including at least one antenna configured to transmit the combined RF output signal.

Clause 24. The dual-input amplifier of clause 22, wherein the dual-input amplifier comprises a Doherty amplifier in which the first power amplifier is a main amplifier and in which the second power amplifier is an auxiliary amplifier.

Clause 25. A transmitter, comprising:
an I/Q generation circuit configured to convert an RF input signal into an in-phase RF signal and a quadrature-phase RF signal, the I/Q generation circuit comprising a polyphase filter;
a first vector-sum phase-shifter configured to process the in-phase RF signal and the quadrature-phase RF signal to produce a first RF signal;
a second vector-sum phase-shifter configured to process the in-phase RF signal and the quadrature-phase RF signal to produce a second RF signal; and
one or more first amplifiers configured to amplify the first RF signal to produce a first amplified RF signal;
one or more second amplifiers configured to amplify the second RF signal to produce a second amplified RF signal; and
a combiner configured to combine the first amplified RF signal and the second amplified RF signal to form a combined RF output signal.

Clause 26. The transmitter of clause 25, wherein the one or more first amplifiers comprises a first series of a first pre-driver amplifier, a first driver amplifier, and a first power amplifier, and wherein the one or more second amplifiers comprises a second series of a second pre-driver amplifier, a second driver amplifier, and a second power amplifier.

Clause 27. The transmitter of any of clauses 25-26, wherein the polyphase filter is a two-stage polyphase filter.

Clause 28. The transmitter of clause 27, wherein the two-stage polyphase filter is a two-stage transconductance-capacitor (gm-C) polyphase filter.

Clause 29. The transmitter of clause 27, wherein the two-stage polyphase filter is a two-stage resistor-capacitor (RC) polyphase filter.

Clause 30. The transmitter of any of clauses 25-29, wherein the one or more first amplifiers includes a main amplifier of a Doherty amplifier, and wherein the one or more second amplifiers includes an auxiliary amplifier of the Doherty amplifier.

Clause 31. A phase-reconfigurable circuit, comprising:
means for generating an in-phase RF signal and a quadrature-phase RF signal;
first means for amplifying and combining the in-phase RF signal and the quadrature-phase RF signal to provide a first phase-shifted RF signal;
second means for amplifying and combining the in-phase RF signal and the quadrature-phase RF signal to provide a second phase-shifted RF signal;
one or more first amplifiers configured to amplify the first phase-shifted RF signal to produce a first amplified RF signal;
one or more second amplifiers configured to amplify the second phase-shifted RF signal to produce a second amplified RF signal; and
a combiner configured to combine the first amplified RF signal and the second amplified RF signal to form a combined RF output signal.

In some instances, well-known structures and devices are shown in block diagram form in order to avoid obscuring the concepts of the described examples. The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A phase-reconfigurable circuit, comprising:
a single-ended-to-differential converter configured to convert an RF input signal into a differential RF input signal;
an I/Q generation circuit configured to convert the differential RF input signal into a differential in-phase RF signal and a differential quadrature-phase RF signal;
a first vector-sum phase-shifter configured to process the differential in-phase RF signal and the differential quadrature-phase RF signal to produce a first differential RF signal; and
a second vector-sum phase-shifter configured to process the differential in-phase RF signal and the differential quadrature-phase RF signal to produce a second differential RF signal.

2. The phase-reconfigurable circuit of claim 1, wherein the I/Q generation circuit comprises a polyphase filter.

3. The phase-reconfigurable circuit of claim 2, wherein the polyphase filter comprises a transconductance-capacitor (gm-C) polyphase filter.

4. The phase-reconfigurable circuit of claim 3, wherein the gm-C polyphase filter comprises a two-stage gm-C polyphase filter.

5. The phase-reconfigurable circuit of claim 2, wherein the polyphase filter comprises a resistor-capacitor (RC) polyphase filter.

6. The phase-reconfigurable circuit of claim 1, wherein the I/Q generation circuit comprises a transformer-based I/Q generation circuit.

7. The phase-reconfigurable circuit of claim 1, wherein the first vector-sum phase-shifter comprises:
a first pair of output terminals;
a first transconductance amplifier configured to transconduct the differential in-phase RF signal to output a first differential current across the first pair of output terminals; and
a second transconductance amplifier configured to transconduct the differential quadrature-phase RF signal to output a second differential current across the first pair of output terminals.

8. The phase-reconfigurable circuit of claim 7, wherein the second vector-sum phase-shifter comprises:
a second pair of output terminals;
a third transconductance amplifier configured to transconduct the differential in-phase RF signal to output a third differential current across the second pair of output terminals; and
a fourth transconductance amplifier configured to transconduct the differential quadrature-phase RF signal to output a fourth differential current across the second pair of output terminals.

9. The phase-reconfigurable circuit of claim 1, further comprising:
a first differential-to-single-ended converter configured to convert the first differential RF signal into a first single-ended RF output signal; and
a second differential-to-single-ended converter configured to convert the second differential RF signal into a second single-ended RF output signal, wherein the phase-reconfigurable circuit is integrated into a transmitter including:
a first pre-driver amplifier configured to amplify the first single-ended RF output signal to form a first pre-driver RF output signal; and
a second pre-driver amplifier configured to amplify the second single-ended RF output signal to form a second pre-driver RF output signal.

10. The phase-reconfigurable circuit of claim 9, wherein the transmitter further includes:
a first driver amplifier configured to amplify the first pre-driver RF output signal to form a first driver RF output signal; and
a second driver amplifier configured to amplify the second pre-driver RF output signal to form a second driver RF output signal.

11. The phase-reconfigurable circuit of claim 10, wherein the transmitter further includes:
a dual-input power amplifier including a first power amplifier configured to amplify the first driver RF output signal to form a first power amplifier output signal and a second power amplifier configured to amplify the second driver RF output signal to form a second power amplifier output signal; and
a combiner configured to combine the first power amplifier output signal and the second power amplifier output signal to form a combined RF output.

12. The phase-reconfigurable circuit of claim 11, wherein the dual-input power amplifier comprises a Doherty amplifier.

13. The phase-reconfigurable circuit of claim 11, wherein the dual-input power amplifier comprises an outphasing amplifier.

14. The phase-reconfigurable circuit of claim 11, wherein the dual-input power amplifier comprises a balanced amplifier.

15. The phase-reconfigurable circuit of claim 14, wherein the balanced amplifier comprises a load-modulated balanced amplifier.

16. A phase-reconfigurable circuit method, comprising:
converting an RF input signal into a differential RF input signal;
converting the differential RF input signal into a differential in-phase RF signal and a differential quadrature-phase RF signal;
processing the differential in-phase RF signal and the differential quadrature-phase RF signal in a first vector-sum phase-shifter to produce a first differential RF signal;
differential-to-single-ended converting the first differential RF signal into a first RF output signal;
processing the differential in-phase RF signal and the differential quadrature-phase RF signal in a second vector-sum phase-shifter to produce a second differential RF signal; and
differential-to-single-ended converting the second differential RF signal into a second RF output signal.

17. The method of claim 16, further comprising:
amplifying both the first RF output signal and the second RF output signal in a dual-input power amplifier to produce a combined RF output signal.

18. The method of claim 17, further comprising:
transmitting the combined RF output signal over at least one antenna.

19. The method of claim 16, wherein processing the differential in-phase RF signal and the differential quadrature-phase RF signal in the first vector-sum phase-shifter comprises:

selecting from a set of in-phase gains to provide a selected in-phase gain amplifying the in-phase differential RF signal by the selected in-phase gain to provide an amplified in-phase differential RF signal;

selecting from a set of quadrature-phase gains to provide a selected quadrature-phase gain amplifying the quadrature-phase differential RF signal by the selected quadrature-phase gain to provide an amplified quadrature-phase differential RF signal; and combining the amplified in-phase differential RF signal and the amplified quadrature-phase differential RF signal to form the first differential RF signal.

20. A dual-input amplifier, comprising:
a first vector-sum phase-shifter configured to process a differential in-phase RF signal and a differential quadrature-phase RF signal to produce a first differential RF signal;
a first differential-to-single-ended converter configured to convert the first differential RF signal into a first RF output signal;
a first pre-driver amplifier configured to amplify the first RF output signal to form a first pre-driver RF signal;
a first driver amplifier configured to amplify the first pre-driver RF signal to form a first driver RF signal; and
a first power amplifier configured to amplify the first driver RF signal to form a first power amplifier RF output signal.

21. The dual-input amplifier of claim 20, further comprising:
a second vector-sum phase-shifter configured to process the differential in-phase RF signal and the differential quadrature-phase RF signal to produce a second differential RF signal;
a second differential-to-single-ended converter configured to convert the second differential RF signal into a second RF output signal;
a second pre-driver amplifier configured to amplify the second RF output signal to form a second pre-driver RF signal;
a second driver amplifier configured to amplify the second pre-driver RF signal to form a second driver RF signal; and
a second power amplifier configured to amplify the second driver RF signal to form a second power amplifier RF output signal.

22. The dual-input amplifier of claim 21, further comprising:

a combiner configured to combine the first power amplifier RF output signal with the second power amplifier RF output signal to form a combined RF output signal.

23. The dual-input amplifier of claim 22, wherein the dual-input amplifier is integrated into a transmitter including at least one antenna configured to transmit the combined RF output signal.

24. The dual-input amplifier of claim 22, wherein the dual-input amplifier comprises a Doherty amplifier in which the first power amplifier is a main amplifier and in which the second power amplifier is an auxiliary amplifier.

25. A transmitter, comprising:
an I/Q generation circuit configured to convert an RF input signal into an in-phase RF signal and a quadrature-phase RF signal, the I/Q generation circuit comprising a polyphase filter;
a first vector-sum phase-shifter configured to process the in-phase RF signal and the quadrature-phase RF signal to produce a first RF signal;
a second vector-sum phase-shifter configured to process the in-phase RF signal and the quadrature-phase RF signal to produce a second RF signal;
one or more first amplifiers configured to amplify the first RF signal to produce a first amplified RF signal;
one or more second amplifiers configured to amplify the second RF signal to produce a second amplified RF signal; and
a combiner configured to combine the first amplified RF signal and the second amplified RF signal to form a combined RF output signal.

26. The transmitter of claim 25, wherein the one or more first amplifiers comprises a first series of a first pre-driver amplifier, a first driver amplifier, and a first power amplifier, and wherein the one or more second amplifiers comprises a second series of a second pre-driver amplifier, a second driver amplifier, and a second power amplifier.

27. The transmitter of claim 25, wherein the polyphase filter is a two-stage polyphase filter.

28. The transmitter of claim 27, wherein the two-stage polyphase filter is a two-stage transconductance-capacitor (gm-C) polyphase filter.

29. The transmitter of claim 27, wherein the two-stage polyphase filter is a two-stage resistor-capacitor (RC) polyphase filter.

30. The transmitter of claim 25, wherein the one or more first amplifiers includes a main amplifier of a Doherty amplifier, and wherein the one or more second amplifiers includes an auxiliary amplifier of the Doherty amplifier.

* * * * *